(12) United States Patent
Brockman et al.

(10) Patent No.: US 9,437,850 B2
(45) Date of Patent: *Sep. 6, 2016

(54) BATTERY CONSTRUCTION FOR INTEGRATION OF BATTERY MANAGEMENT SYSTEM AND METHOD

(71) Applicant: Johnson Controls Technology Company, Holland, MI (US)

(72) Inventors: Daryl C. Brockman, Shorewood, WI (US); James Cameron Douglass, Shorewood, WI (US)

(73) Assignee: Johnson Controls Technology Company, Holland, MI (US)

( * ) Notice: Subject to any disclaimer, the term of this patent is extended or adjusted under 35 U.S.C. 154(b) by 168 days.

This patent is subject to a terminal disclaimer.

(21) Appl. No.: 14/266,620

(22) Filed: Apr. 30, 2014

(65) Prior Publication Data

US 2015/0318582 A1 Nov. 5, 2015

(51) Int. Cl.
*H01M 10/46* (2006.01)
*H01M 2/10* (2006.01)
(Continued)

(52) U.S. Cl.
CPC ........ *H01M 2/1072* (2013.01); *G01R 31/3606* (2013.01); *H01M 10/0525* (2013.01); *H01M 10/425* (2013.01); *H01M 10/4257* (2013.01); *H01M 10/482* (2013.01); *H01M 10/486* (2013.01); *H01M 10/488* (2013.01); *H01M 10/637* (2015.04); *H02J 7/0011* (2013.01); *H02J 7/0052* (2013.01); *G01R 31/3624* (2013.01); *G01R 31/3686* (2013.01); *H01M 2010/4271* (2013.01); *H01M 2010/4278* (2013.01); *H01M 2220/20* (2013.01); *Y02E 60/122* (2013.01)

(58) Field of Classification Search
CPC .... H02J 7/0047; H02J 7/0042; H02J 7/0021; H02J 7/355
USPC .................. 320/107, 112, 114, 132, 149, 150
See application file for complete search history.

(56) References Cited

U.S. PATENT DOCUMENTS 5,444,378 A 8/1995 Rogers
6,002,240 A 12/1999 McMahan et al.
(Continued)

FOREIGN PATENT DOCUMENTS

DE 10211115908 4/2013
GB 2245781 1/1992
(Continued)

OTHER PUBLICATIONS

Konishi, et al. Development of 12 V Lithium-ion Battery for Start and Stop Vehicle System, GS Yuasa International Ltd., 2013.
(Continued)

*Primary Examiner* — Edward Tso
(74) *Attorney, Agent, or Firm* — Fletcher Yoder, P.C.

(57) ABSTRACT

A battery module includes a battery management system disposed in a housing of the battery module. The battery management system is configured to monitor an operational parameter of the battery module. The battery management system is electrically coupled to a positive terminal and a negative terminal of the battery module. The battery module also includes a connector disposed in an outer surface of the housing. The connector includes a plurality of electrical contacts and is electrically coupled to the battery management system.

27 Claims, 5 Drawing Sheets

(51) Int. Cl.
*G01R 31/36* (2006.01)
*H02J 7/00* (2006.01)
*H01M 10/42* (2006.01)
*H01M 10/0525* (2010.01)
*H01M 10/48* (2006.01)
*H01M 10/637* (2014.01)

(56) References Cited

U.S. PATENT DOCUMENTS

| | | | |
|---|---|---|---|
| 6,300,763 B1 * | 10/2001 | Kwok | G01R 31/3651 320/132 |
| 6,850,034 B2 | 2/2005 | Seils et al. | |
| 7,378,313 B2 | 5/2008 | Zheng | |
| 7,443,138 B2 | 10/2008 | Ishikawa et al. | |
| 7,481,664 B1 * | 1/2009 | Knoll | H01R 13/6275 439/359 |
| 7,604,898 B2 | 10/2009 | Yuasa et al. | |
| 7,881,042 B2 | 2/2011 | Buiel et al. | |
| 7,998,616 B2 | 8/2011 | Buiel et al. | |
| 8,023,251 B2 | 9/2011 | Buiel et al. | |
| 8,192,865 B2 | 6/2012 | Buiel et al. | |
| 8,202,653 B2 | 6/2012 | Buiel et al. | |
| 8,551,659 B2 | 10/2013 | Endo et al. | |
| 2007/0059587 A1 | 3/2007 | Kishi et al. | |
| 2008/0278115 A1 | 11/2008 | Huggins | |
| 2009/0103242 A1 | 4/2009 | Buiel et al. | |
| 2009/0195074 A1 | 8/2009 | Buiel | |
| 2009/0312885 A1 | 12/2009 | Buiel | |
| 2010/0026915 A1 | 2/2010 | Pozin et al. | |
| 2010/0040950 A1 | 2/2010 | Buiel et al. | |
| 2010/0091430 A1 | 4/2010 | Buiel et al. | |
| 2010/0151989 A1 | 6/2010 | Read | |
| 2011/0014501 A1 | 1/2011 | Scheucher | |
| 2011/0248680 A1 * | 10/2011 | Timmons | H01M 2/1072 320/120 |
| 2011/0281162 A1 | 11/2011 | Buiel et al. | |
| 2011/0293980 A1 | 12/2011 | Tartaglia | |
| 2011/0293987 A1 | 12/2011 | Tartaglia | |
| 2011/0293997 A1 | 12/2011 | Tartaglia | |
| 2012/0003509 A1 | 1/2012 | Gerber | |
| 2012/0031645 A1 | 2/2012 | Tartaglia | |
| 2012/0149258 A1 | 6/2012 | Tartaglia | |
| 2012/0225331 A1 | 9/2012 | Tartaglia | |
| 2012/0244399 A1 | 9/2012 | Tartaglia | |
| 2012/0318590 A1 | 12/2012 | Read | |
| 2013/0300190 A1 * | 11/2013 | Mao | G01R 31/3624 320/152 |
| 2013/0328522 A1 | 12/2013 | Brockman et al. | |
| 2014/0210399 A1 * | 7/2014 | Urschel | H02J 1/00 320/107 |

FOREIGN PATENT DOCUMENTS

| | | |
|---|---|---|
| JP | 2008154323 | 7/2008 |
| JP | 2009288034 | 12/2009 |
| JP | 2011060614 | 3/2011 |

OTHER PUBLICATIONS

PCT/US2015/026993 International Search Report and Written Opinion dated Sep. 23, 2015.

* cited by examiner

BATTERY CONSTRUCTION FOR INTEGRATION OF BATTERY MANAGEMENT SYSTEM AND METHOD

BACKGROUND

The invention relates generally to battery devices and systems and, more particularly, to a vehicle battery management system.

Batteries composed of one or more electrochemical cells capable of converting chemical energy into a more readily usable form of electrical energy are widely employed in many industries and applications. For example, many such batteries are starting, lighting, and ignition (SLI) batteries capable of starting the internal combustion engines of motorcycles, cars, trucks, and other vehicles. Batteries of this type can typically be discharged and replenished with charge in multiple cycles before the life cycle of the battery is depleted. Typically, when an end user purchases a new battery, for example, for integration into a vehicle, such as a motorcycle, the charge level of the battery is unknown. Unfortunately, upon insertion into the user's vehicle, the battery may not function if the charge level of the battery has been depleted, for example, during the time the battery was on a display shelf before purchase. Additionally, charging of such batteries typically requires connection of lead cables to the battery terminals, which can be cumbersome and time consuming. Accordingly, there exists a need for battery systems that overcome these drawbacks of traditional systems.

SUMMARY

The present disclosure relates to a battery module including a housing and a plurality of battery cells disposed in the housing. The battery module also includes a battery management system disposed in the housing. The battery management system is configured to monitor one or more operational parameters of the battery module. The battery management system is electrically coupled to a positive terminal and a negative terminal of the battery module. Additionally, the battery module includes a connector disposed in an outer surface of the housing. The connector includes a plurality of electrical contacts. The connector is electrically coupled to the battery management system.

The present disclosure also relates to a battery module including a housing and a plurality of battery cells disposed in the housing. The battery module also includes a battery management system disposed in the housing. The battery management system is electrically coupled to a positive terminal and a negative terminal of the battery module. The battery management system includes a thermocouple configured to generate a signal related to a temperature of the battery module. The battery management system also includes a voltmeter configured to generate a signal related to a voltage of the battery module. Further, the battery management system includes a processor configured to determine one or more operational parameters of the battery module based at least in part upon the signal from the thermocouple and the signal from the voltmeter. The battery management system also includes a memory configured to store operational parameter history information, usage information, or a combination thereof. Furthermore, the battery module includes a connector disposed in an outer surface of the housing. The connector is electrically coupled to the battery management system. The connector is configured for power input, power output, data input, and data output.

The present disclosure further relates to a method including receiving charging power through two pins of a multi-pin connector. The multi-pin connector is disposed in an outer surface of a housing of a battery module. The method also includes transmitting the charging power from the multi-pin connector through a battery management system disposed in the housing and to a positive terminal and a negative terminal of the battery module. The battery management system is electrically coupled to the positive and negative terminals. Further, the method includes charging a plurality of battery cells disposed in the housing via the charging power provided to the positive and negative terminals.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

As described in more detail below, present embodiments are directed towards systems and methods for battery monitoring and management. Systems and methods may include a battery management system including one or more sensors and processing circuitry. The battery management system may monitor parameters of the battery, such as voltage, temperature, current, and state of charge. Additionally, the battery management system may protect the battery by performing cell balancing. Furthermore, the battery management system may protect the battery by preventing over-discharge (e.g., under-voltage) of the battery and/or of individual cells of the battery, input over-voltage, input over-current, and over-heating by monitoring operational parameters of the battery and placing the battery into a sleep mode in response to detected undesirable operating conditions. The battery management system may include a connector adapted to couple a state of charge indicator to the battery management system so that the state of charge indicator may provide an indication of the state of charge of the battery. As such, the state of charge indicator may be tethered to the battery via the connector. The state of charge indicator may also interface between the battery management system and a charging system. In some embodiments, the state of charge indicator may include a reset button (e.g., momentary contact switch) adapted to allow for manually placing the battery into a sleep mode and manually reactivating the battery (i.e., "waking" from sleep mode).

Figure 1:
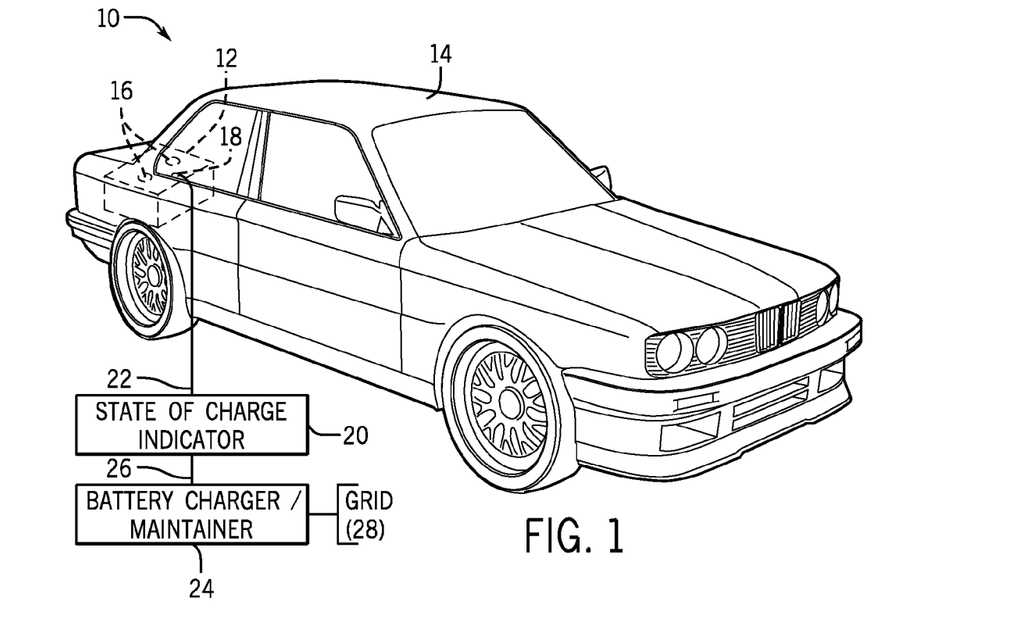
FIG. 1 is a perspective view of FIG. 1 is perspective view of an embodiment of a vehicle having a battery module and showing attachment of the battery to a state of charge indicator coupled to a battery charger or maintainer.

With the foregoing in mind, FIG. 1 illustrates a battery system 10 including a battery 12 disposed in a vehicle 14. The battery 12 may typically be used in a vehicle, as shown, which may be a car, truck, boat, motorcycle, recreational vehicle, golf cart, four wheeler, offroad vehicle, power sports vehicle, power water craft, or other vehicle that uses battery power. While the battery 12 is illustrated as being positioned in the trunk or rear of the vehicle 14, the location of the battery 12 may differ in other embodiments. For example, the position of the battery 12 may be selected based on the available space within the vehicle, the desired weight balance of the vehicle, the location of other components used with the battery system 10 (e.g., cooling devices, etc.), and a variety of other considerations. In some contexts and embodiments, the battery may be somewhat difficult to access, and aspects of the present disclosure allow for checking the state of charge of the battery, charging the battery, controlling sleep mode and other operations of the battery, and so forth, while the battery is still installed, greatly facilitating these operations when such access is difficult.

The battery 12 may be a starting, lighting, and ignition (SLI) battery of any desired design, type, voltage, and capacity, or the battery 12 may be a deep cycle battery, depending on the vehicle type and the application. Moreover, the battery may be designed and constructed in accordance with any currently known or later developed technology, such as wet cell technologies, glass mat technologies, gel cell technologies, etc. In some embodiments, the battery 12 may be a lithium-ion battery. Further, in some embodiments, the battery 12 may be a summer-only battery and may not be adapted for use during the winter. Similarly, when the vehicle is only used sporadically or seasonally, the techniques described allow for management of the battery charge and functions to accommodate such selected use.

The battery 12 includes positive and negative terminals 16, which may be coupled to a wiring harness or other components within the vehicle 14 that utilize the voltage output of the battery 12. Present embodiments of the battery 12 may also include a connector 18 (e.g., a multi-conductor connector), such as a female plug, to couple external electrical conductors to internal components of the battery 12. For example, as illustrated, the connector 18 may couple a state of charge indicator 20 to the battery 12 via a lead 22 of the state of charge indicator 20 disposed in the connector 18. As will be described in more detail below, the state of charge indicator 20 may receive data from the battery 12, such as the voltage of the battery 12, and may provide an indication of the state of charge of the battery 12. Additionally, the state of charge indicator 20 may be adapted to couple to a battery charger/maintainer 24 with a lead 26.

Once the state of charge indicator 20 is electrically coupled to the charger/maintainer 24, electrical charging power may be applied through the lead 26, the state of charge indicator 20, the lead 22, and the connector 18, in order, to build up a charge in the battery 12. The battery charger/maintainer 24 may receive power from a power grid 28 or other power source, which provides AC power to the battery system 10. It should be noted that the battery charger/maintainer 24 may be any desirable battery charger or battery maintainer configured for use with the battery 12. Battery chargers typically provide a high charging current to the battery 12 in order to charge the battery 12 relatively quickly (e.g., overnight), while battery maintainers typically provide a lower current "trickle" flow of charging power to the battery 12. As may be understood by one skilled in the art, the battery charger/maintainer 24 may be portable, or may have a fixed location. Moreover, the charger/maintainer may implement any desired charging regime, such as regimes based on sensed voltage, stage of charge, battery voltage and capacity, and so forth.

Figure 2:
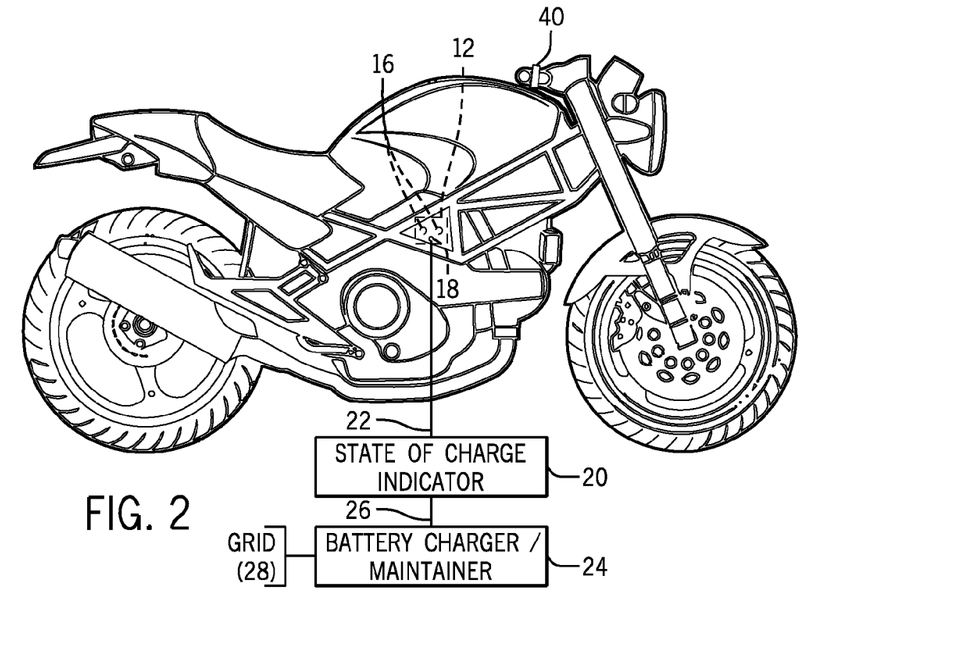
FIG. 2 is a perspective view of an embodiment of a motorcycle having a battery module coupled to a state of charge indicator that may be coupled to a battery charger or maintainer.

Similarly, FIG. 2 illustrates a motorcycle 40 having the battery 12 attached to the state of charge indicator 20. Because the battery 12 in the motorcycle 40 (or certain other vehicles 14) may be difficult to access for connecting equipment directly to the terminals 16, providing the state of charge indicator 20 may be desirable. The state of charge indicator 20 may be internally coupled to the terminals 16 and the connector 18 of the battery 12 via the lead 22. Thus, the state of charge indicator 20 allows the user to read the state of charge of the battery 12 and to charge or maintain the battery 12 without requiring any disassembly to reach the terminals 16. Again, the power grid 28 may provide AC power to the battery system 10. Such arrangements may facilitate connection of the battery 12 to the charger/maintainer 24 by simply plugging the charger/maintainer 24 into the state of charge indicator 20 when desired.

It should be noted that when reference is made in the present disclosure to connections to the battery terminals, in many implementations, the connection will actually be made internally within the battery. That is, such connections may be made to connectors, conductors, or at other points where the internal battery circuits extend to and from the actual external terminals.

Figure 3:
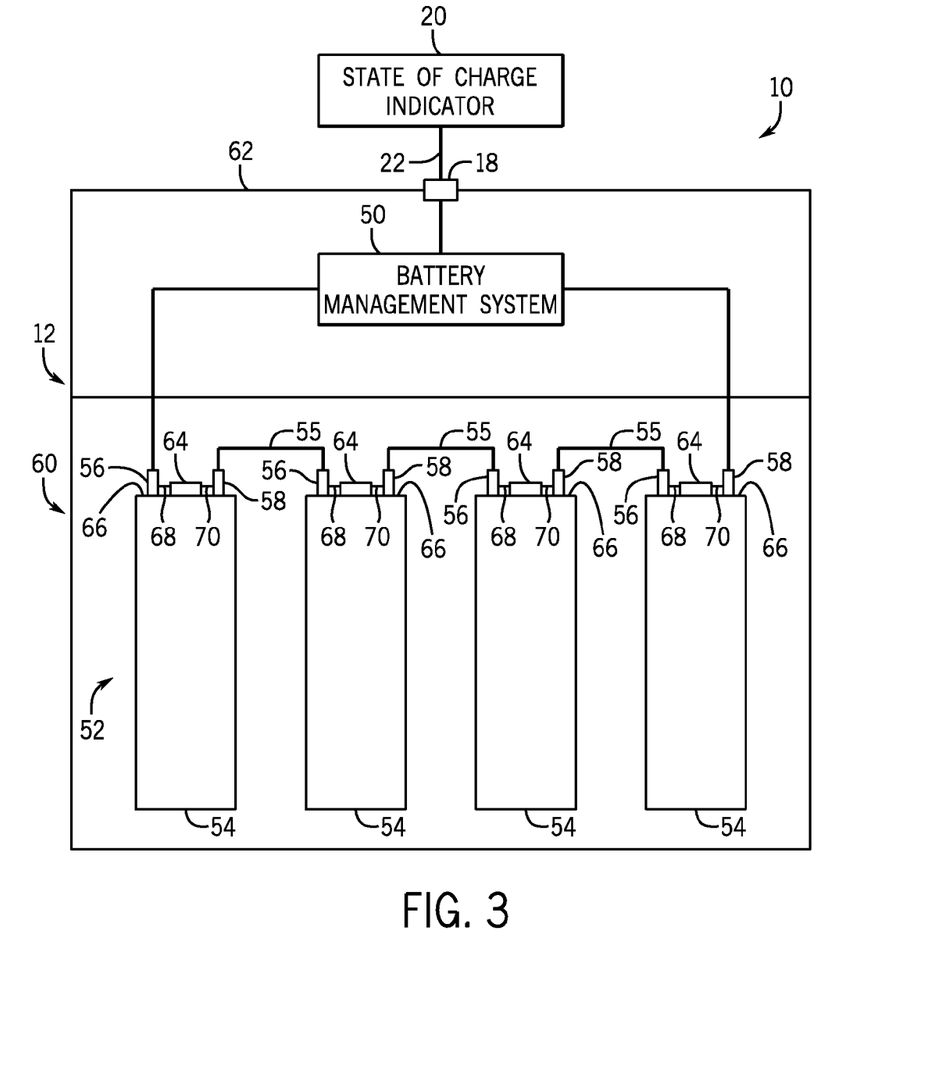
FIG. 3 is a schematic diagram of an embodiment of a state of charge indicator and a battery including a battery management system.

FIG. 3 shows an embodiment of the battery system 10 including the battery 12, which includes an integrated (e.g., self-contained) battery management system 50. As illustrated, the battery 12 includes an array 52 of battery cells 54 electrically coupled to the battery management system 50. In certain embodiments, the battery cells 54 may be lithium-ion cells, lithium-iron phosphate cells, lithium polymer cells, nickel-metal-hydride cells, or any other suitable type of electrochemical cells. Additionally, the battery cells 54 may have any suitable physical configurations, such as prismatic, oval, cylindrical, polygonal, etc.

In the illustrated embodiment, the battery cells 54 are connected in series via bus bars 55. That is, each bus bar 55 is coupled between a positive terminal 56 of one battery cell 54 and a negative terminal 58 of an adjacent battery cell 54. However, it should be appreciated that the battery cells 54 may be employed in alternative array configurations, such as in parallel or in any other suitable arrangements involving parallel and serial configurations. Further, while four battery cells 54 are illustrated within the array 52, any suitable number of battery cells 54 may be utilized.

In some embodiments, multiple battery cells 54 may be grouped into modules, with multiple modules forming the array 52. In such embodiments, a first bus bar may be electrically coupled to the positive terminal 56 of each battery cell 54 within a module, and a second bus bar may be electrically coupled to the negative terminal 58 of each battery cell 54 within the module. The bus bars, in turn, may be electrically coupled to the battery management system 50 and configured to transfer an electrical power signal from the battery cells 54 to the battery management system 50. Multiple modules may be connected in series and/or parallel to form the array 52 and to provide a desired electrical power output to a starting, lighting, ignition component of the vehicle 14, a vehicle propulsion system, or some other load. For example, in one embodiment, the battery system 10 may include two modules connected in parallel, and each module may include four battery cells 54 connected in series. Among other functions, the battery management system may be connected to the cells at points that allow for balancing of loads and draws from the cells or groups, as discussed below.

As noted above, the battery 12 also includes the integrated (e.g., self-contained) battery management system 50. In certain embodiments, the battery management system 50 may include one or more integrated circuits or printed circuit boards including discrete components mounted and interconnected on the printed circuit board, and the battery management system 50 may operate using power received from the array 52 of battery cells 54 (e.g., via a regulated power supply). Additionally, the battery management system 50 may be disposed within a housing 60 of the battery 12. In some embodiments, the battery management system 50 may be disposed under a cover 62 of the battery 12. For example, the battery management system 50 may be mounted to or permanently affixed to an interior surface of the cover 62. In other embodiments, the battery management system 50 may be disposed between the cover 62 and the array 52 of battery cells 54. For example, as will be described in more detail below with respect to FIG. 5, the battery management system 50 may be mounted to or permanently affixed to a support structure (e.g., a board mount) located above the array 52 of battery cells 54 such that the battery monitoring system 50 is offset from the cover 62 and the array 52.

As will be described in more detail below, the battery management system 50 may be adapted to monitor and provide feedback related to the health of the battery 12. For example, the battery management system 50 may be adapted to monitor one or more operational parameters of the battery 12, such as a voltage, temperature, or current. Additionally, the battery management system 50 may provide data relating to the one or more operational parameters of the battery 12. For example, the battery management system 50 may provide data, such as the state of charge of the battery 12, to the state of charge indicator 20 via the connector 18. Additionally, the battery management system 50 may log events (e.g., an event where an operational parameter exceeds a threshold) and may provide data regarding the events to a data input/output tool. Furthermore, the battery management system 50 may perform cell balancing, which may increase the performance and life of the battery 12. Additionally, the battery management system 50 may protect the battery cells 54 from damage by transitioning the battery 12 to a sleep mode in response to detection of adverse events. For example, as described in more detail below, the battery management system 50 may force the battery 12 into a sleep mode when a voltage or current of the battery 12 drops below a predetermined level or in response to a sleep signal received from the state of charge indicator 20.

To enable the monitoring of the battery 12, the battery management system 50 may be adapted to receive signals from cell measurement electronics that monitor one or more parameters of the battery cells 54 of the array 52. For example, a measurement device 64 may be associated with each battery cell 54, or group of battery cells 54, in the array 52, and may be adapted to output signals to the battery monitoring system 50. As illustrated in FIG. 3, the measurement device 64 may be mounted to an exterior surface 66 of each battery cell 54. In certain embodiments, the measurement device 64 may be one or more sensors (e.g., a thermocouple, a voltmeter, an ammeter, etc.). In other embodiments, the measurement device 64 may be a printed circuit board or an integrated circuit that includes one or more sensors (e.g., a thermocouple, a voltmeter, an ammeter, etc.).

While the illustrated embodiment includes a measurement device 64 mounted to the exterior surface 66 of each battery cell 54, it should be noted that in other embodiments, the measurement devices 64 may be permanently affixed to the respective exterior surfaces 66, mounted to or otherwise affixed to an interior surface of each battery cell 54, or arranged in any other suitable arrangement. As illustrated, each measurement device 64 includes a first lead 68 coupled to the positive terminal 56 of a respective battery cell 54, and second lead 70 coupled to the negative terminal 58 of the respective battery cell 54. Thus, each measurement device 64 may be communicatively coupled to the battery monitoring system 50. Furthermore, in other embodiments, the measurement devices 64 may be sensors disposed on the battery management system (e.g., sensors disposed on the printed circuit board of the battery management system 50), and the measurement devices 64 may include leads coupling each measurement device 64 to the terminals 56 and 58 of a respective battery cell 54. Thus, the measurement devices 64 may be associated with a respective battery cell 54, but not directly mounted to or affixed to the respective battery cell 54. In some embodiments, the battery system 10 may include a combination of measurement devices 64 that are mounted to battery cells 54 and measurement devices 64 that are disposed on the battery management system 50 and adapted to monitor operational parameters of a respective battery cell 54 via leads coupled to the terminals 56 and 58 of the respective battery cell 54.

Figure 4:
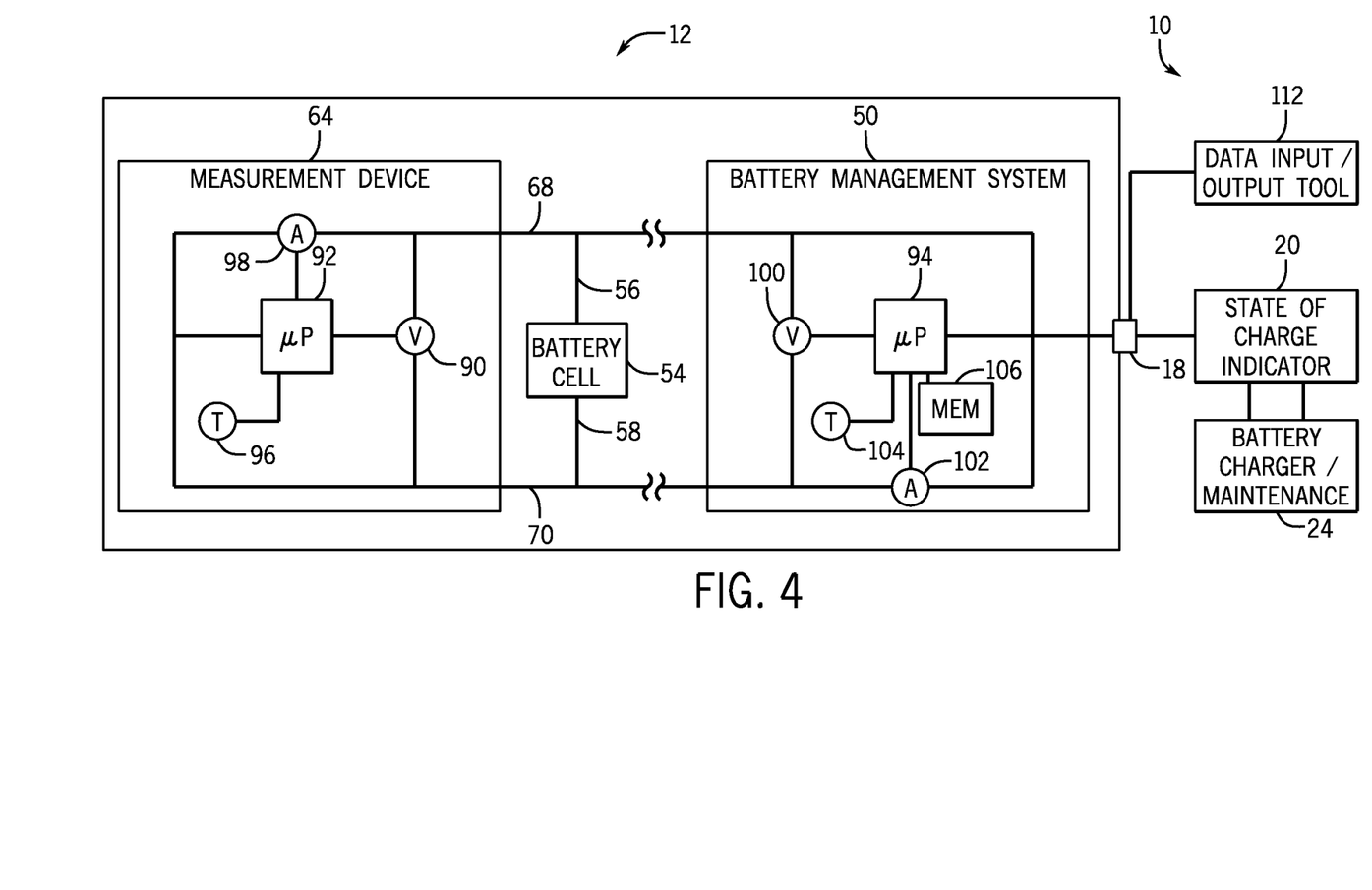
FIG. 4 is a block diagram of an embodiment of the battery of FIG. 3 including the battery management system.

FIG. 4 is a schematic diagram of an embodiment of the battery system 10 including the battery management system 50 and the measurement device 64. As illustrated, the measurement device 64 may include a voltmeter 90 electrically coupled to the first lead 68 and the second lead 70. Because the first lead 68 is electrically coupled to the positive terminal 56 and the second lead 70 is electrically coupled to the negative terminal 58, the voltmeter 90 will measure the voltage across the battery cell 54. In the illustrated embodiment, the voltmeter 90 is also electrically coupled to a microprocessor 92. However, it should be noted while reference is made in the present discussion to a microprocessor, any suitable processing circuitry may be employed. The microprocessor 92 may receive a signal from the voltmeter 90, compute the voltage based on the received signal, and transmit the computed voltage to the battery management system 50. For example, in certain embodiments, the voltmeter 90 may output an analog signal proportional to the measured voltage. The microprocessor 92 may convert the analog signal into a digital signal and may determine the voltage based on the digital signal. However, it should be noted that in some embodiments, the measurement device 64 may not include the microprocessor 92 or processing circuitry. In such embodiments, the voltmeter 90 may output an analog signal to the battery management system 50, which may be adapted to determine the voltage using the received signal. In particular, the battery management system 50 may include a microprocessor 94, or other suitable processing circuitry, which may be configured to receive a signal from the voltmeter 90 and determine the voltage based on the received signal.

As illustrated, the measurement device 64 may also include a thermocouple 96. The thermocouple 96 may be communicatively coupled to the microprocessor 92, if present, and to the microprocessor 94 of the battery management system 50. Because the measurement device 64 may be in direct contact with an interior surface or exterior surface of the battery cell 54, the thermocouple will output a signal indicative of the battery cell temperature. Accordingly, the microprocessor 92 and/or the microprocessor 94 may determine the cell temperature based on the signal. For example, in certain embodiments, the thermocouple 96 may output an analog signal proportional to the measured temperature. In such embodiments, the microprocessor 92 and/or the microprocessor 94 may be configured to convert the analog signal into a digital signal, and to determine the temperature based on the digital signal.

Additionally, the measurement device 64 may include an ammeter 98. The ammeter 98 may be communicatively coupled to the microprocessor 92, if present, and to the microprocessor 94 of the battery management system 50. Accordingly, the microprocessor 92 and/or the microprocessor 94 may determine the current of the battery cell 54 based on the signal. For example, in certain embodiments, the ammeter 98 may output an analog signal proportional to the measured current. In such embodiments, the microprocessor 92 and/or the microprocessor 94 may be configured to convert the analog signal into a digital signal, and to determine the current based on the digital signal.

While the illustrated embodiment of the measurement device 64 includes the voltmeter 90, the thermocouple 96, and the ammeter 98, it should be noted that alternative embodiments may include additional sensors configured to monitor other operational parameters of the battery cell 54. For example, in certain embodiments, the measurement device 54 may include a sensor adapted to measure the specific gravity or pH level of an electrolyte within the battery cell 54, which may be used to in the determination of the state of charge of the battery 12. In further embodiments, the measurement device 64 may include a pressure sensor configured to detect a pressure within the battery cell 54, an ohmmeter, or any other suitable sensor configured to monitor an electrical, physical or chemical parameter of the battery cell 54. Furthermore, in certain embodiments, the measurement device 64 may also include a memory communicatively coupled to the microprocessor 90, which may store information related to the battery cell 54 and/or algorithms to be used by the microprocessor 90 for the calculation of the various operational parameters.

Furthermore, in certain embodiments, the battery management system 50 may include one or more sensors adapted to measure operational parameters of the array 52 of the battery cells 54. As illustrated, the battery management system 50 may include a voltmeter 100 and ammeter 102 that are communicatively coupled to the microprocessor 94 and are adapted to measure the total voltage and current, respectively, of the array 52. Additionally, the battery management system 50 may include a thermocouple 104 communicatively coupled to the microprocessor 94 that is adapted to measure the temperature of one or more battery cells 54 of the array 52. Further, it should be noted that the battery 12 may include any suitable sensor configured to monitor an electrical, physical or chemical parameter of the battery 12. For example, in some embodiments, the battery 12 may include an additional voltmeter and ammeter adapted to measure an input voltage and current, respectively, transmitted from the charger/maintainer 24 to the battery 12.

While reference is made here to certain sensors in the form of "meters", it should be borne in mind that the actual sensors utilized may or may not include some sort of readout, as with conventional "meters". That is, the "meters" (sensors) may be completely internal to the battery and management system.

The microprocessor 94 may be configured to calculate one or more operational parameters of the battery cells 54 and/or the battery 12. For example, as noted above, the microprocessor 94 may receive signals from the voltmeter 90, the thermocouple 96, and the ammeter 98 and may calculate parameters such as the voltage, temperature, and current of the battery cell 54 based on the received signals. Additionally, the microprocessor 94 may calculate the voltage, current, and temperature of the battery 12 based on signals from the voltmeter 100, ammeter 102, and thermocouple 104, respectively. For example, the microprocessor 94 may calculate a voltage and current of the power flowing from the battery cells 54 to the terminals 16 of the battery 12 based on signals received from one or more voltmeters 100 and ammeters 102 disposed on the battery management system 50. In some embodiments, the battery management system 50 is configured to detect and calculate a voltage difference across each individual battery cell 54, and across the entire array 52 of the battery cells 54. This may enable the battery management system 50 to perform cell balancing as desired.

The battery management system 50 may include a memory 106, which may store instructions and/or algorithms for calculating the operational parameters of the battery cells 54 and the battery 12. Furthermore, in certain embodiments, the memory 106 may store thresholds for the operational parameters, such as a maximum temperature of the battery 12, a maximum temperature of a battery cell 54, a minimum voltage, current, and/or state of charge of the battery 12, and a minimum voltage, current, and/or state of charge of a battery cell 54. Accordingly, the microprocessor 94 may be configured to access the memory 106 to read the data stored in the memory 106.

Further, the microprocessor 94 may be configured to calculate the state of charge of the battery 12. The microprocessor 94 may be configured to calculate the state of charge of the battery 12 using any suitable signal or combinations of signals, such as signals from the voltmeter 90 for one or more battery cells 54, from the voltmeter 100 of the battery management system 50, from the ammeter 98 for one or more battery cells 54, and/or from the ammeter 102 of the battery management system 50. In certain embodiments, the microprocessor 94 may be configured to calculate the state of charge of the battery 12 based at least in part upon the voltage of the battery 12, the discharge rate (e.g., discharge curve) of the battery 12, and the temperature of the battery 12. It should be noted that the voltage of the battery 12 may be determined using signals from the voltmeter 90 of one or more battery cells 54 and/or signals from one or more voltmeters 100 of the battery management system 50. Similarly, the temperature of the battery 12 may be determined using signals from the thermocouple 96 of one or more battery cells 54 and/or signals from the thermocouple 104 of the battery management system 50. Furthermore, it should be appreciated that the memory 106 may store information that may be accessed by the microprocessor 94 to facilitate the calculation of the state of charge, such as one or more algorithms and the discharge rate of the battery 12.

The microprocessor 94 may communicate with the state of charge indicator 20 to provide an indication of the calculated state of charge of the battery 12. As noted above, providing the state of charge indicator 20 as a tethered device may be desirable, because the state of charge may be easily assessed without requiring disassembly of the vehicle to access the battery 12. Furthermore, in certain embodiments, the battery 12 may be difficult to access or reach in the vehicle (e.g., a motorcycle), and the tethered state of charge indicator 20 may be more easily accessible for the user than the battery 12.

In some embodiments, the state of charge indicator 20 may be a visual indicator, such as one or more light emitting diodes (LED), that is illuminated in colors that correspond to the state of charge of the battery 12 (e.g., red indicates a discharged state, green indicates a charged state, and yellow indicates a partially charged state). For example, in certain embodiments, if the state of charge of the battery 12 is above a first threshold, the microprocessor 94 may send a signal to the state of charge indicator 20 that causes the state of charge indicator 20 to provide a first indication (e.g., a green LED). Additionally, if the state of charge of the battery 12 is below a second threshold, the microprocessor 94 may send a signal to the state of charge indicator 20 that causes the state of charge indicator 20 to provide a second indication (e.g., a red LED). Further, in certain embodiments, if the state of charge of the battery 12 is between the first and the second threshold, the microprocessor 94 may send a signal to the state of charge indicator 20 that causes the state of charge indicator 20 to provide a third indication (e.g., a yellow LED).

In another embodiment, the state of charge indicator 20 may be a visual indication panel configured to display a percentage corresponding to the ratio of the current charge level to the total possible charge level that defines the battery's capacity. While the illustrated embodiment relates to the state of charge indicator 20, it should be noted that any suitable type of output device (e.g., audio and/or visual output device) may be used to provide feedback to a user relating to the battery 12. Furthermore, it should be noted that the feedback provided by the state of charge indicator 20, or any other suitable output device, is not limited to the state of charge. For example, in other embodiments, an output device may provide feedback related to the temperature of the battery 12, or some other desired parameter.

As noted above, the state of charge indicator 20 also interfaces between the battery 12 and the battery charger/maintainer 24. Using the state of charge indicator 20 as an interface for coupling to the charger/maintainer 24 may be desirable because the user may more easily access the state of charge indicator 20 than the terminals 16 of the battery 12. Generally, a battery charger may charge the battery 12 overnight, while a battery maintainer may charge the battery over a longer period of time, and/or simply maintain a desired state of charge. For example, a battery maintainer may be used to maintain the charge level of a battery of a power sports vehicle, which may discharge during periods of inactivity. The charger/maintainer 24 may include power conversion circuitry to convert or condition incoming power from the grid 26 in any way necessary to produce an output suitable for charging the battery 12. Additionally, in certain embodiments, the charger/maintainer 24 may include charging control circuitry to monitor and control the delivery of charge to the battery 12. In some embodiments, the charger/maintainer 24 may receive data, such as a state of charge of the battery 12, from the battery management system 50 via the state of charge indicator 20, and the charging control circuitry of the charger/maintainer 24 may use the received data to control the delivery of charge to the battery 12. In other embodiments, the battery management system 50 may monitor the state of charge of the battery 12 and control the delivery of charge via start or stop signals sent to the charger/maintainer 24. For example, the microprocessor 94 may be configured to send signals to the charger/maintainer 24 via the state of charge indicator 20 to initiate or stop the flow of charge based at least in part upon the state of charge of the battery 12, the state of charge of one or more of the battery cells 54, the voltage of the battery 12, the voltage of one or more of the battery cells 54, and/or any other suitable operational parameter. In one embodiment, the battery management system 50 may be configured to stop the flow of charge to the battery 12 in response to a determination that the state of charge of the battery 12 has reached a maximum state of charge threshold or the voltage of the battery 12 has reached a maximum voltage threshold. As such, the battery management system 50 may protect the battery cells 54 from overcharging.

The battery management system 50 may also protect the battery cells 54 from damage by monitoring operational parameters of the battery 12 and controlling the delivery of charge to the battery 12. For example, the battery management system 50 may monitor the state of charge and/or voltage of each battery cell 54 of the battery 12 and control the delivery of charge to the battery 12 to facilitate cell balancing. The battery cells 54 may discharge at different rates, which may be intensified by higher battery cell temperatures. As a result, the battery cells 54 may be at different levels of charge (e.g. after a period of discharging or inactivity). While battery cells 54 in parallel may self balance to the lowest voltage, battery cells 54 in series may remain at different voltages. Thus, during charging, one or more battery cells 54 may reach a full state of charge earlier than other battery cells 54 in the array 52. Overcharging the battery cells 54 that are fully charged may damage the battery cells 54. Thus, it may be desirable to halt charging and balance the battery cells 54 before resuming charging.

Accordingly, the battery management system 50 may be configured to control a cell balancing system adapted to balance the battery cells 54. The cell balancing system may be external or internal to the battery management system 50. In certain embodiments, the battery management system 50 may apply a balancing algorithm to the battery cells 54, which may select battery cells with the highest levels of charge (e.g., any battery cell with a state of charge or voltage greater than the battery cell with the lowest state of charge or voltage). The selected battery cells may be discharged by parallel resistors until the state of charge of the lowest charged battery cell is reached. Once the battery cells 54 are balanced, the battery management system 50 may send a signal to the charger/maintainer 24 to resume charging. It should be noted that in certain embodiments, the battery management system 50 may be configured to balance the battery cells 54 any suitable number of times throughout a charging process. Furthermore, the battery management system 50 (and other components of the battery 12) may be adapted to implement passive and/or active cell balancing techniques. For example, during passive balancing, the discharged energy from the most charged battery cell or cells may be dissipated as heat. In contrast, during active balancing, energy may be drawn from the most charged battery cell or cells and transferred to the least charged battery cell or cells. For example, the battery management system 50 may include DC-DC converters adapted to transfer the energy from the most charged battery cells to the least charged battery cells. Furthermore, the battery management system 50 may be adapted to implement continuous cell balancing. That is, the battery management system 50 may balance the battery cells 54 during a charging process and while discharging during use.

Additionally, the battery management system 50 may be configured to place the battery 12 into a sleep mode to protect the battery cells 54 from damage. For example, the battery management system 50 may electronically control the opening and closing of an internal switch, such as a solid state switch (e.g., a field-effect transistor (FET) or a metal-oxide-semiconductor field-effect transistor (MOSFET)) that may be placed-in line with the terminals 16. Opening the solid state switch will prevent current flow from the battery 12, which will disconnect the battery 12 from the vehicle 14 and place the battery 12 into a sleep mode. In particular, the battery management system 50 may be configured to monitor one or more operational parameters of the battery 12 and/or the battery cells 54 and may place the battery 12 into a sleep mode to avoid over-discharge (e.g., under-voltage), over-voltage (e.g., during charging), over-heating, or any other undesirable battery conditions. For example, as will be described in more detail below with respect to FIG. 7, the microprocessor 94 may be configured to compare the voltage measured by the voltmeter 90 for each battery cell 54 and/or the voltage measured by the voltmeter 100 to a minimum voltage threshold, and the battery management system 50 may place the battery 12 into a sleep mode in response to a determination that the voltage of the battery 12 is below the minimum voltage threshold to avoid over-discharge of the battery 12. In certain embodiments, the minimum voltage threshold may be above a minimum voltage for starting the vehicle 14. Additionally, the microprocessor 94 may be configured to compare the temperature measured by the thermocouple 96 for each battery cell 54 and/or the temperature measured by the thermocouple 104 to a maximum temperature threshold, and the battery management system 50 may force the battery 12 into a sleep mode in response to a determination that the temperature of the battery 12 is greater than the maximum temperature threshold. Furthermore, the battery management system 50 may be configured to place the battery 12 into the sleep mode in response to a signal received from the state of charge indicator 20. For example, the state of charge indicator 20 may receive a user input (e.g., a user may press a button of the state of charge indicator 20) to selectively force the battery 12 into the sleep mode. It may be desirable to enable a user to easily place the battery 12 into the sleep mode if the battery 12 will be unused for a period of time to prevent or minimize discharge of the battery 12. In the sleep mode, the operation of the battery, charging, discharging, and/or monitoring may change. For example, further discharging may be avoided by electrically uncoupling the input and output conductors of the battery. Similarly, certain monitoring functions may be stopped or placed on a less frequent update basis to conserve energy. In the sleep mode, certain connections to the state of charge indicator (external or installed on the battery) may be maintained, however, to allow for manually re-initiating ("waking") the battery and/or management system, such as by depressing a momentary contact switch, as discussed below.

In addition to monitoring and providing feedback related to the operational parameters, the battery management system 50 may also be configured to store historical data indicative of the operational parameters. In certain embodiments, the battery management system 50 may store a history (e.g., log) of exceptions in the memory 106. For example, the memory 106 may store information related to events when the voltage, current, and/or temperature of the battery 12 (or one or more of the battery cells 54) exceeded a maximum predetermined threshold. In some embodiments, the memory 106 may also store information related to events when the voltage, current, and/or temperature of the battery 12 (or one or more of the battery cells 54) was below a minimum predetermined threshold. The memory 106 may store a count of the number of times that the operational parameter (e.g., voltage, current, and/or temperature) was outside of the predetermined thresholds. In certain embodiments, the memory 106 may also store a time stamp and/or duration associated with each event. Furthermore, the memory 106 may be configured to store usage information, such as average load, maximum load on the battery 12, duration of operation, or other parameters that may be useful for monitoring the operational status of the battery 12.

Exception logging may be desirable to analyze the performance of the battery 12. For example, the historical data may be useful for post mortem analysis, manufacturing data, sales data, engineering design purposes, or for warranty uses, such as determining whether a replacement battery or refund should be issued. To access the historical data stored in the memory 106, a data input/output tool 112 may be coupled to the connector 18 and may download data from the memory 106. The data input/output tool 112 may then analyze the downloaded data or may transmit the data to a processing device, such as a computer, for analysis. Additionally, the data input/output tool 112 may be configured to transmit data to the battery management system 50 for storage in the memory 106. For example, the data input/output tool 112 may transmit data such as the predetermined thresholds for the operational parameters, algorithms for computing the operational parameters, identification data for the battery 12, or any other suitable information.

Figure 5:
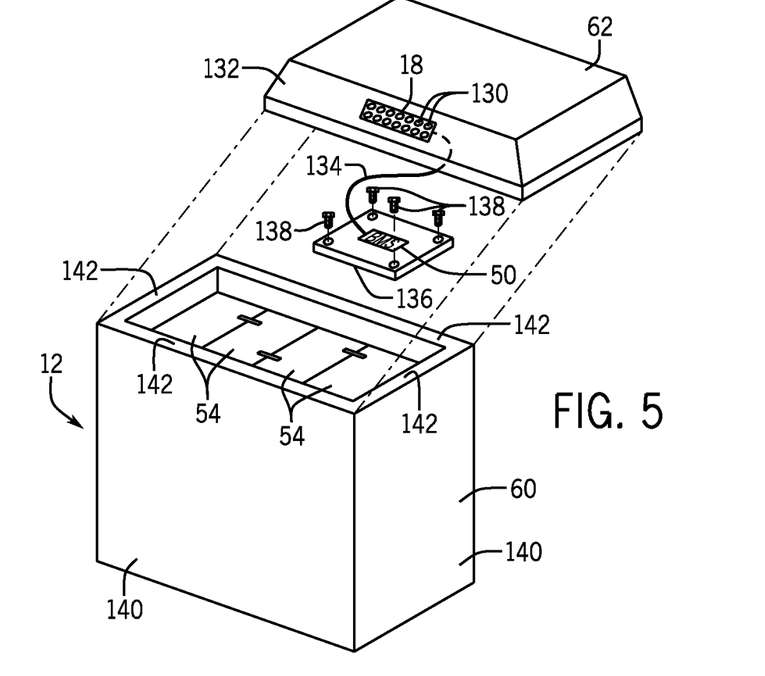
FIG. 5 is a partial exploded view of an embodiment of the battery of FIG. 3 including the battery management system.

FIG. 5 is a partial exploded view of the battery 12 in which the cover 62 is removed from the housing 60 of the battery 12 to illustrate an embodiment of the battery management system 50 and the connector 18. As illustrated, the connector 18 may be a female pin connector. However, it should be noted that in other embodiments, the connector 18 may be a male connector and/or may be a different type of connector. The connector 18 includes one or more electrical contacts adapted to electrically couple to a complementary connector (e.g., a male pin connector) to transmit signals and/or power across the connector interface. In particular, the connector 18 may be adapted to physically and electrically couple to a connector of the state of charge indicator 20. Further, the connector 18 may be adapted to physically and electrically couple to a connector of the data input/output tool 112. To enable the physical and electrical coupling to the state of charge indicator 20 and the data input/output tool 112, the connector 18 may include a shape (e.g., dimensions and geometry) and pin configuration that is complementary to a shape and pin configuration of the connector of the state of charge indicator 20 and of the connector of the data input/output tool 112.

In certain embodiments, the connector 18 may include a proprietary shape and pin configuration. For example, the connector 18 may be keyed. In one embodiment, the proprietary shape and pin configuration may be selected such that the connector 18 does not couple to any connectors other than the state of charge indicator 20 and the data input/output tool 112.

Furthermore, the connector 18 may include any suitable number of pins (e.g., if the connector 18 is male) or socket contacts (e.g., if the connector 18 is female). In certain embodiments, the connector 18 may include six or seven socket contacts 130. For example, the connector 18 may include a first socket contact 130 for data input and a second socket contact 130 for data output, which may be adapted to couple to electrical contacts of the data input/output tool 112 or electrical contacts of the state of charge indicator 20. For example, the first socket contact 130 may be used to download data to the memory 106 of the battery management system 50 from the data input/out tool 112. Additionally, the second socket contact 130 may be used to transmit historical data relating to exceptions from the memory 106 to the data input/output tool 112. The connector 18 may also include a third socket contact 130 for power input and a fourth socket contact 130 for power output, which may be adapted to couple to electrical contacts of the state of charge indicator 20.

Further, the connector 18 may include a fifth socket contact 130 and a sixth socket contact 130 to activate one or more indicator lights (e.g., LEDs) of the state of charge indicator 20. For example, the state of charge indicator 20 may include two indicator lights, such as a red indicator light and a green indicator light. The battery management system 50 may send a signal using the fifth socket contact 130 to activate the green indicator light if the battery management system 50 determines that the state of charge of the battery 12 is above a predetermined threshold. Similarly, the battery management system 50 may send a signal using the sixth socket contact 130 to activate the red indicator light if the battery management system 50 determines that the state of charge of the battery 12 is below a predetermined threshold. The absence of the signals may deactivate the respective indicator light. Additionally, in certain embodiments, the state of charge indicator may include a third indicator light (e.g., a yellow LED), and the battery management system 50 may send a signal over an additional socket contact to activate the yellow indicator light if the battery management system 50 determines that the state of charge of the battery is within a predetermined threshold range. In other embodiments, the battery management system 50 may send a binary signal (e.g., a two-bit or three-bit binary signal) using the fifth socket contact 160 (or any other suitable socket contact) to selectively activate the indicator lights of the state of charge indicator 20 (e.g., a red, green, and/or yellow indicator light). For example, the battery management system 50 may send a first binary signal (e.g., 001) to selectively activate a green indicator of the state of charge indicator 20, a second binary signal (e.g., 010) to selectively activate a yellow indicator of the state of charge indicator 20, and a third binary signal (e.g., 100) to selectively activate a red indicator of the state of charge indicator 20. In such embodiments, the battery management system 50 may send a power signal via the sixth socket contact 130 (or any other suitable socket contact) to power the selectively activated indicator light of the state of charge indicator 20.

Additionally, the connector 18 may include a seventh socket contact 130 adapted to receive a sleep mode signal from the state of charge indicator 20. However, it should be appreciated that the connector 18 may include additional socket contacts 130 for data input, data output, indicator light control, or any other signals. For example, in other embodiments, an additional socket contact may be used to transmit usage data from the memory 106 to the data input/output tool 112.

Additionally, the connector 18 may conform to a connection standard that provides a high intrusion protection rating. In particular, the shape of the connector 18 and position of the connector 18 may protect the socket contacts from moisture, dirt, and debris. For example, the connector 18 may be recessed in the cover 62 of the battery 12 such that the cover 62 extends past the connector 18 and minimizes exposure to the connector 18. Further, as illustrated, the connector 18 may be disposed about a side wall 132 of the cover 62. While the connector 18 may be disposed in other locations of the cover 62, it may be advantageous to position the connector 18 on a side portion of the cover 62 to further minimize exposure of the connector 18 to moisture, dirt, and debris that may contact the top of the battery cover 62.

The connector 18 is electrically coupled to the battery management system 50 via one or more leads 134. As illustrated, the battery management system 50 may be disposed between the battery cells 54 and the cover 62 of the battery 12. The battery management system 50 may be disposed on a support 136, which may be coupled to the housing 60 and/or the cover 62. Accordingly, the support 136 may include a plurality of attachment features 138 (e.g., screws) to couple the support 136 to the housing 60 and/or the cover 62. For example, the support 136 may couple to side walls 140 of the housing 60. In one embodiment, the support 136 may couple to top portions 142 of the side walls 140. It should be noted that in some embodiments in which the support 136 couples to the housing 60, the battery management system 50 is located a distance away from the battery cells 54 such that the battery management system 50 does not contact the battery cells 54. Disposing the battery management system 50 at a distance away from the battery cells 54 may be advantageous to protect the battery management system 50 from possible electrolyte leakage, overheating, or pressure. Additionally, in some embodiments, the support 136 and the battery management system 50 may be disposed in an interior chamber just under the cover 62 that is formed by the top wall 140 and side walls 132 of the cover 62. In such embodiments, the support 136 may be secured to the cover 62 or secured to the housing 60 and adapted to extend past the side walls 140 of the housing 60. In other embodiments, the support 136 may be integral with the housing 60 or the cover 62. However, the battery management system 50 may be removable from the battery 12.

Figure 6:
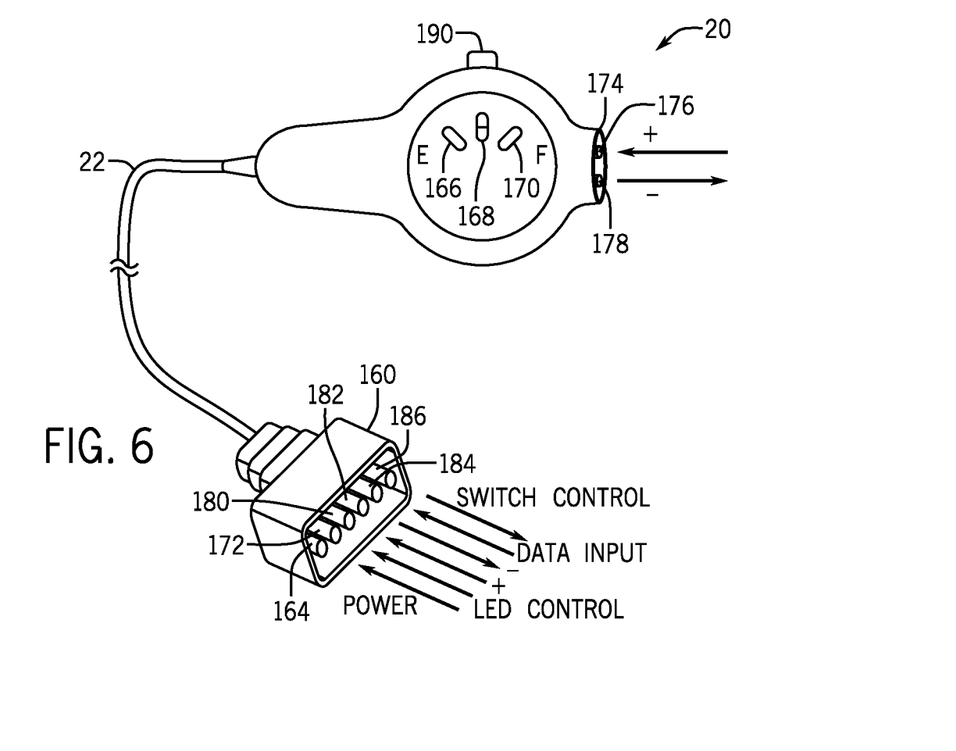
FIG. 6 is a perspective view of an embodiment of the state of charge indicator of FIG. 3.

FIG. 6 is a perspective view of an embodiment of an exemplary state of charge indicator 20 including a connector 160 (e.g., a multi-conductor connector) adapted to couple to the connector 18 of the battery 12. The connector 160 may be removably coupled (e.g., toollessly removably coupled) to the connector 18 of the battery 12. As illustrated, the state of charge indicator 20 may be coupled to the connector 160 via the lead 22. The lead 22 may increase the accessibility of the state of charge indicator 20. The lead 22 may be any suitable length. For example, the length of the lead 22 may be between approximately one foot and five feet or between approximately two feet and four feet. In one embodiment, the length of the lead 22 may be approximately three feet.

As illustrated, the connector 160 may be a male pin connector. However, it should be noted that in other embodiments, the connector 160 may be a female connector and/or may be a different type of connector. The connector 160 may include one or more electrical contacts adapted to electrically couple to the connector 18 to transmit signals and/or power across the connector interface. Accordingly, the connector 160 may include a shape (e.g., dimensions and geometry) and pin configuration that is complementary to the shape and pin configuration of the connector 18 of the battery 12. In some embodiments, the connector 160 may include a proprietary shape and pin configuration, such as one with a high intrusion protection rating.

Additionally, the connector 160 may include any suitable number of pins (e.g., if the connector 160 is male) or socket contacts (e.g., if the connector 160 is female). In certain embodiments, the connector 160 may include six, seven, or eight pins. For example, the connector 160 may include pins for power input, power output, data input, data output, control of indicator lights, and control of a sleep mode switch in the battery 12. Furthermore, it should be noted that in some embodiments, the connector 18 of the battery 12 may include more electrical contacts than the connector 160. For example, the connector 18 may include electrical contacts that are adapted to couple to the data input/output tool 112 and are not adapted to couple to the connector 160. However, the connector 160 may still fit entirely over the connector 18 of the battery 12.

As illustrated, the connector 160 may include a first pin 164 for power input, which may be adapted to transmit power from the battery 12 to the state of charge indicator 20. In some embodiments, the state of charge indicator 20 may be adapted to operate using power from the battery 12. For example, the state of charge indicator 20 may include one or more indicator lights, which may use power from the battery 12. As illustrated, the state of charge indicator 20 includes a first indicator light 166, a second indicator light 168, and a third indicator light 170. The indicator lights may be LEDs, LCDs, organic LEDs, etc. In some embodiments, the first indicator light 166 may a red LED to provide an indication that the state of charge of the battery 12 is low (e.g., less than 10% charged). The state of charge indicator 20 may include a graphic, such as the letter "E", proximate to the first indicator light 166 to provide a further indication that the first indicator light 166 represents a low state of charge. The second indicator light may be a yellow or orange LED to provide an indication that the state of charge of the battery is deleted (e.g., between 10% and 50% charged). Additionally, the third indicator light 170 may be a green LED to provide an indication that the battery is mostly charged (e.g., at least 50% charged). The state of charge indicator 20 may also include a graphic such as the letter "F", proximate to the third indicator light 170 to provide a further indication that the third indicator light represents a full state of charge. It should be noted that the state of charge percentages associated with the indicator lights are merely provided as examples and may vary in other embodiments. Further, in some embodiments, the state of charge indicator 20 may feature two indicator lights instead of three.

As noted above, the indicator lights may be activated by the battery management system 50 using binary control. In certain embodiments, the battery management system 50 may transmit a signal to the state of charge indicator over a second pin 172 of the connector 160 to selectively activate the first indicator light 166, the second indicator light 168, or the third indicator light 170. By way of example, the battery management system 50 may transmit a first signal (e.g., 001) to selectively activate the first indicator light 166, a second binary signal (e.g., 010) to selectively activate the second indicator light 168, and a third binary signal (e.g., 100) to selectively activate the third indicator light 170. In other embodiments, the battery management system 50 may transmit a power signal over three pins to activate the indicator light associated with the respective pin. For example, as noted above, the battery management system 50 may transmit a power signal over a first pin to activate the first indicator light 166, a power signal over a second pin to activate the second indicator light 168, and a power signal over a third pin to activate the third indicator light 170. As noted above, the absence of the power signals may deactivate the respective indicator light.

While the illustrated embodiment relates to indicator lights for providing an indication of the state of charge, it should be noted that in other embodiments, the state of charge indicator 20 may be adapted to provide a numerical indication of the state of charge, a segmented display in which each segment represents a percentage of the state of charge, a single indicator (e.g., an LED or graphic) to provide an indication of a low state of charge, or any other suitable state of charge indication. Further, it should be noted that in other embodiments, the state of charge indicator 20 may also be adapted to provide information relating to other operational parameters of the battery, such as temperature, voltage, and/or current, information relating to the health of the battery, and/or an indication of whether the battery 12 is receiving charge.

As noted above, the state of charge indicator 20 interfaces between the battery management system 50 and the charger/maintainer 24. As such, the state of charge indicator 20 functions as an entry point for the charging system. As illustrated, the state of charge indicator 20 includes a second connector 174 (e.g., a multi-conductor connector) for coupling to the charger/maintainer 24. The second connector 174 may be directly coupled the body of the state of charge indicator 20, as illustrated, or may be coupled to the state of charge indicator 20 via a lead. The connector 174 may be any suitable connector, such as a male pin connector, female pin connector, etc. The connector 174 may include a first pin 176 and a second pin 178 adapted to receive power from the charger/maintainer 24. Additionally, to transmit the power to the battery management system 50, the connector 160 may include a third pin 180 and a fourth pin 182 for charging the battery 12. As noted above, the battery management system 50 may be adapted to transmit data (e.g., state of charge data) to the charger/maintainer 24 via the state of charge indicator 20, which may be used by the charger/maintainer 24 to control the delivery of charge to the battery 12. Accordingly, the connector 160 may include a fifth pin 184 adapted for data input to receive the data from the battery management system 50, and the connector 178 may include an additional pin adapted for data output to transmit the received data to the charger/maintainer 24. However, it should be noted that in some embodiments, the state of charge indicator may not be configured to transmit data from the battery management system 50 to the charger/maintainer 24 and, thus, may not include the fifth pin 184 and the additional pin to facilitate data transfer to the charger/maintainer 24.

Additionally, the connector 160 may include a seventh pin 186 configured to transmit a signal to the battery management system 50 to control a switch (e.g., a solid state switch) to disconnect the battery 12 from the vehicle and force the battery 12 into a sleep mode. In particular, a signal may be transmitted from the state of charge indicator 20 to the battery management system 50 in response to the manual depression of a reset button 190 of the state of charge indicator 20. Forcing the battery 12 into a sleep mode using the reset button 190 may be advantageous to minimize discharge of the battery 12 during periods of disuse, such as a summer power sports vehicle that is stored over the winter. Additionally, the reset button 190 may function as an antitheft device by disconnecting the battery 12 from the vehicle 14. In certain embodiments, a signal may be transmitted from the state of charge indicator 20 to the battery management system 50 after the reset button 190 has been depressed for a predetermined amount of time. For example, the state of charge indicator 20 may be adapted to send the signal after the reset button 190 has been depressed for 2 seconds, 3 seconds, 4 seconds, 5 seconds, or any other suitable amount of time.

The reset button 190 may also function to reactivate the battery 12. For example, depression of the reset button 190, when the battery is in the sleep mode, may cause the state of charge indicator 20 to transmit a signal to the battery management system 50 to control the switch to reconnect the battery 12 to the vehicle 14. In certain embodiments, the reactivation signal may be transmitted from the state of charge indicator 20 to the battery management system 50 after the reset button 190 has been depressed for a predetermined amount of time. The predetermined amount of time may be the same as or different from the predetermined amount of time to disconnect the battery 12 from the vehicle. For example, the state of charge indicator 20 may be adapted to send the reactivation signal after the reset button 190 has been depressed for 2 seconds, 3 seconds, 4 seconds, 5 seconds, or any other suitable amount of time.

While the illustrated embodiment relates to a reset button that may be depressed, in other embodiments, the reset button 190 may be a slide switch or an on/off lever that may be adapted to move between an on state and an off state. In such embodiments, the state of charge indicator 20 may be adapted to transmit a signal to the battery management system 50 immediately following the translation of the switch or lever from an on state to an off state, or vice versa, or may be adapted to transmit the signal after a predetermined amount of time. Further, it should be noted that the reset button 190 may be disposed about any suitable location of the state of charge indicator 20.

Figure 7:
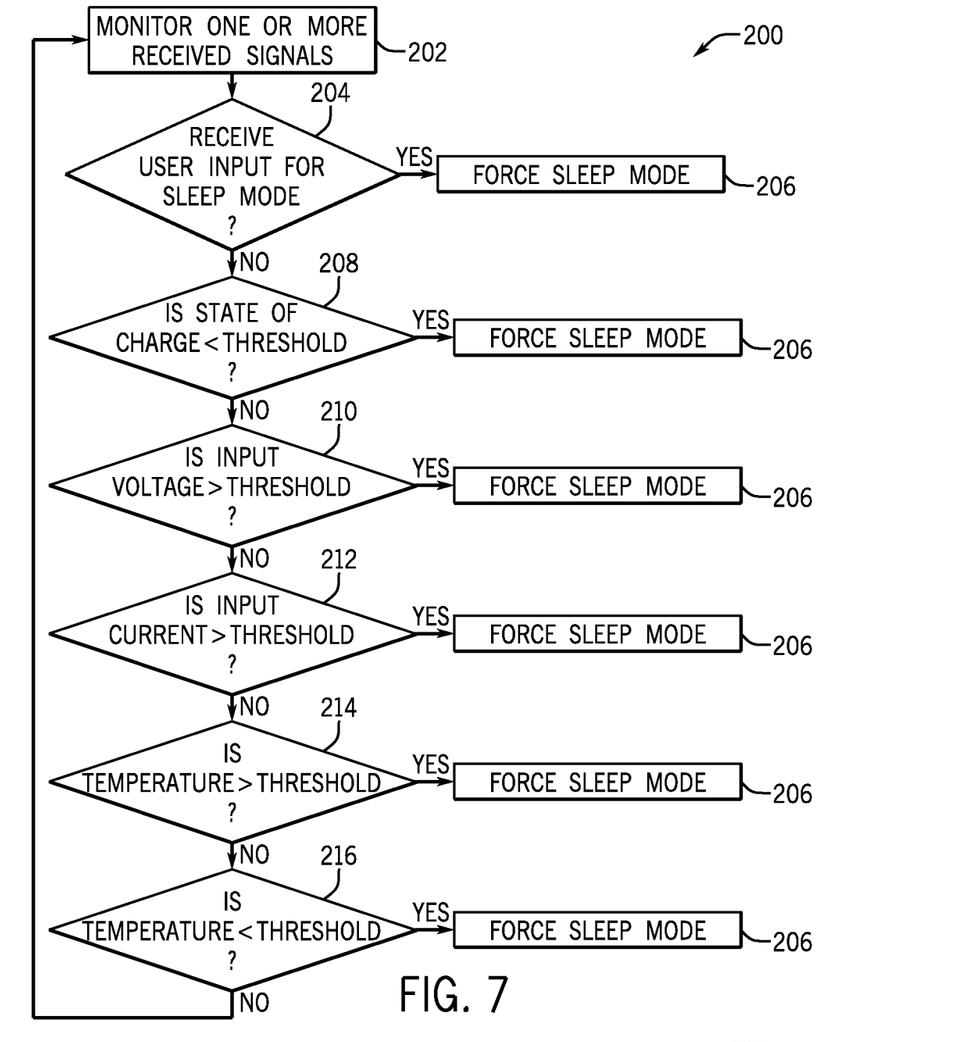
FIG. 7 is a flow chart representing logic of a sleep mode regime adapted to transition the battery of FIG. 3 into a sleep mode.

FIG. 7 is a flow chart depicting exemplary logic 200 executed by the battery management system 50 for sleep mode control of the battery 12. As noted above, the battery management system 50 may be configured to monitor the battery 12 to determine whether the battery 12 should be placed into a sleep mode to protect the battery 12. For example, the battery management system 50 may be adapted to analyze one or more operational parameters of the battery 12 to prevent over-discharge (e.g., under-voltage), over-voltage (e.g., during charging), over-current (e.g., during charging), over-temperature, or any other undesirable battery conditions. Further, the battery management system 50 may be configured to place the battery 12 into a sleep mode in response to a user input.

As illustrated, the battery management system 50 may monitor one or more received signals (block 202). The one or more received signals may be signals from one or more sensors disposed in the battery 12. For example, the received signals may be generated by the voltmeter 90 for each battery cell 54, the thermocouple 96 for each battery cell 54, the ammeter 98 for each battery cell 54, the voltmeter 100 of the battery management system 50, the ammeter 102 of the battery management system 50, the thermocouple 104 of the battery management system 50, a voltmeter adapted to measure the input voltage from the charger/maintainer 24, an ammeter adapted to measure the input current from the charger/maintainer 24, etc. As described in detail above, the microprocessor 94 may be configured to compute operational parameters of the battery 12 (e.g., voltage, current, temperature, etc.) based on the signals. Additionally, the battery management system 50 may receive one or more signals from the microprocessor 92 of the measurement device 64 for each battery cell 54, and the signals may include computed operational parameters for the respective battery cell 54. Further, the battery management system 50 may receive signals from the state of charge indicator 20 in response to the depression of the reset button 190.

As shown in block 204, the battery management system 50 may be configured to determine whether a user input to place the battery 12 into a sleep mode has been received. For example, if the battery 12 is active and connected to the vehicle 14, and the battery management system 50 receives a signal from the state of charge connector 20 (e.g., transmitted over the seventh pin 186), the battery management system 50 may determine that a user input to place the battery 12 into the sleep mode has been received. Accordingly, in response to the user input, the battery management system 50 may force the battery 12 into sleep mode (block 206). In certain embodiments, the battery management system 50 may electronically control the opening and closing of an internal switch, such as a solid state switch (e.g., a field-effect transistor (FET) or a metal-oxide-semiconductor field-effect transistor (MOSFET)), to place the battery 12 into a sleep mode. In such embodiments, opening the switch will prevent current flow from the battery 12, thereby disconnecting the battery 12 from the vehicle 14 and placing the battery 12 into the sleep mode.

If the battery management system 50 does not receive a user input to place the battery into the sleep mode, the battery management system 50 may continue to monitor and analyze the received signals to determine whether the battery 12 should be placed into the sleep mode. For example, the battery management system 50 may determine whether the state of charge of the battery 12 is less than a predetermined threshold (block 208). As set forth above, the state of charge of the battery 12 may be determined based on the voltage, current, and/or temperature of the battery 12. Additionally or alternatively, the battery management system 50 may determine whether the depth of discharge of the battery is greater than a predetermined depth of discharge threshold. Furthermore, in certain embodiments, the voltage of the battery may be used as an approximation of the state of charge of the battery. In certain embodiments, the predetermined threshold may be based at least in part upon the parameters of the battery 12 and the minimum charge for starting the vehicle 14. For example, if the vehicle 14 requires at least 11 volts to start, the predetermined threshold may be at least 11 volts. In some embodiments, the predetermined threshold may be approximately 11.3 volts. As such, the battery 12 may have an amount of charge sufficient to start the vehicle 14 and to power the vehicle 14 for a period of time until the battery 12 receives charge from the charger/maintainer 24. If the battery management system 50 determines that the state of charge of the battery 12 is less than the predetermined threshold, the battery management system 50 may force the battery 12 into sleep mode (block 206) to prevent over-discharge (e.g., under-voltage).

Additionally, the battery management system 50 may be adapted to protect the battery 12 during charging. For example, the battery management system 50 may determine whether an input voltage to the battery 12 from the charger/maintainer is greater than a predetermined threshold (block 210). If the battery management system 50 determines that the input voltage to the battery 12 is greater than the predetermined threshold, the battery management system 50 may force the battery 12 into sleep mode (block 206) to prevent input over-voltage. Similarly, the battery management system 50 may determine whether an input current to the battery 12 from the charger/maintainer is greater than a predetermined threshold (block 212). If the battery management system 50 determines that the input current to the battery 12 is greater than the predetermined threshold, the battery management system 50 may force the battery 12 into sleep mode (block 206) to prevent input over-current. It should be noted that the predetermined thresholds for input voltage and input current may be selected based upon the parameters of the battery 12.

Furthermore, the battery management system 50 may be configured to monitor the temperature of the battery 12 to prevent overheating. For example, the battery management system 50 may determine whether the temperature of the battery 12 is greater than a predetermined threshold (block 214). As noted above, the temperature of the battery 12 may be determined using the thermocouple 104 and/or the thermocouple 96 of one or more battery cells 54. If the battery management system 50 determines that the temperature of the battery 12 is greater than the predetermined threshold, the battery management system 50 may force the battery 12 into sleep mode (block 206) to prevent overheating. Additionally, the battery management system 50 may determine whether the temperature of the battery 12 and/or the temperature of one or more battery cells 54 of the battery 12 is less than a predetermined threshold (block 216). In certain embodiments, it may be desirable for the battery management system 50 to monitor the temperature of the battery 12 and/or the temperature of one or more battery cells 54 during charging, because charging the battery 12 when the temperature is below a predetermined temperature may damage the battery cells 54. For example, charging certain lithium batteries when the temperature of the battery is below zero degrees Fahrenheit may damage the battery cells. Thus, the battery management system 50 may force the battery into sleep mode (block 206) to prevent damage to the battery cells (e.g., during charging) if the battery management system 50 determines that the temperature is below the predetermined threshold.

Moreover, it should be noted that in certain embodiments, the battery management system 50 may be configured to consider a combination of operating parameters to determine whether to transition the battery 12 to the sleep mode (block 206). In certain embodiments, the battery management system 50 may transition the battery 12 to the sleep mode if two or more operating parameters (e.g., temperature, state of charge, depth of discharge, input voltage, input current, etc.) violate a respective predetermined threshold. By way of example, if the battery temperature is 110 degrees Fahrenheit and all other operating parameters do not violate a respective predetermined threshold, the battery management system 50 to may not transition the battery 12 to sleep mode. Additionally, if the voltage is 14.8 volts and all other operating parameters do not violate a respective predetermined threshold, the battery management system 50 to may not transition the battery 12 to sleep mode. However, if the battery temperature is 110 degrees Fahrenheit and the voltage is 14.8 volts, the battery management system 50 may transition the battery to the sleep mode.

Figure 8:
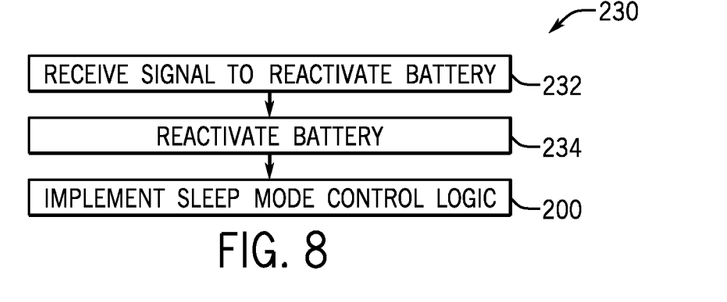
FIG. 8 is a flow chart representing logic of a wake-up regime adapted to transition the battery of FIG. 3 from a sleep mode to an operational mode.

As noted above, the reset button 190 of the state of charge indicator 20 may also be used to reactivate the battery 12. FIG. 8 is a flow chart depicting exemplary logic 230 executed by the battery management system 50 for reactivation of the battery 12. As illustrated, the battery management system 50 may receive a signal from the state of charge indicator 20 to reactivate the battery 12 (block 232). As noted above, depressing the reset button 190 of the state of charge indicator 20 may generate a signal that causes the battery management system 50 to alter the state of the internal switch (e.g., from open to closed or vice versa). Thus, if the battery 12 is in the sleep mode, the received signal may cause the battery management system 50 to close the switch and reactivate the battery 12 (block 234).

In some embodiments, a condition may have been detected, such as under-voltage, input over-voltage, input over-current, or over-heating, that caused the battery management system 50 to place the battery 12 into sleep mode. This condition may still be present when the battery 12 is reactivated. Accordingly, the battery management system 50 may implement the sleep mode control logic 200 to continue to monitor the operational parameters of the battery 12 and protect the battery 12 from undesirable operating conditions after the battery 12 is reactivated. As such, if the condition (e.g., under-voltage, input over-voltage, input over-current, or over-temperature) persists after the battery 12 is placed into sleep mode and then reactivated, the battery management system 50 may place the battery 12 back into the sleep mode to avoid damage to the battery 12.

While only certain features and embodiments of the disclosure have been illustrated and described, many modifications and changes may occur to those skilled in the art (e.g., variations in sizes, dimensions, structures, shapes and proportions of the various elements, values of parameters (e.g., temperatures, pressures, etc.), mounting arrangements, use of materials, colors, orientations, etc.) without materially departing from the novel teachings and advantages of the subject matter recited in the claims. The order or sequence of any process or method steps may be varied or re-sequenced according to alternative embodiments. It is, therefore, to be understood that the appended claims are intended to cover all such modifications and changes as fall within the true spirit of the disclosed embodiments. Furthermore, in an effort to provide a concise description of the embodiments, all features of an actual implementation may not have been described (i.e., those unrelated to the presently contemplated best mode of carrying out the disclosed embodiments, or those unrelated to enabling the claimed disclosed embodiments). It should be appreciated that in the development of any such actual implementation, as in any engineering or design project, numerous implementation specific decisions may be made. Such a development effort might be complex and time consuming, but would nevertheless be a routine undertaking of design, fabrication, and manufacture for those of ordinary skill having the benefit of this disclosure, without undue experimentation.

The invention claimed is:

1. A battery module, comprising:
   a housing;
   a plurality of battery cells disposed in the housing;
   a battery management system disposed in the housing and comprising a thermocouple, wherein the battery management system is configured to monitor one or more operational parameters of the battery module including a battery temperature, wherein the battery management system is electrically coupled to a positive terminal and a negative terminal of the battery module; and a connector disposed in an outer surface of the housing, wherein the connector comprises a plurality of electrical contacts, and wherein the connector is electrically coupled to the battery management system.

2. The battery module of claim 1, wherein the plurality of battery cells comprises lithium ion battery cells.

3. The battery module of claim 1, wherein the battery management system comprises a memory configured to store operational parameter history information, usage information, or a combination thereof.

4. The battery module of claim 3, wherein the battery management system comprises an integrated circuit having a processor, the thermocouple, and the memory.

5. The battery module of claim 3, wherein the memory is configured to store one or more respective thresholds for the one or more operational parameters of the battery module.

6. The battery module of claim 5, wherein the battery management system comprises a processor configured to:
compare the one or more operational parameters to the respective one or more thresholds; and
cause the memory to store information relating to events in which the one or more operational parameters exceeded the respective one or more thresholds.

7. The battery module of claim 6, wherein the information comprises a number of times that an operational parameter of the one or more operational parameters exceeded its respective threshold of the one or more thresholds.

8. The battery module of claim 1, wherein the battery management system comprises a voltmeter, and wherein the one or more operational parameters of the battery module comprise a battery voltage.

9. The battery module of claim 1, comprising a sensor associated with each battery cell of the plurality of battery cells and electrically coupled to the battery management system, wherein each sensor is configured to generate a signal relating to an operational parameter of the respective battery cell.

10. The battery module of claim 9, wherein the battery management system comprises a processor configured to determine one of the operational parameters of the battery module based at least in part upon the signal generated by each sensor.

11. The battery module of claim 1, wherein the housing comprises a cover configured to seal the housing, and wherein the cover comprises the connector.

12. The battery module of claim 1, comprising a cover configured to seal the housing and board mount configured to support the battery management system, wherein the board mount is disposed between the plurality of battery cells and the cover.

13. The battery module of claim of claim 1, wherein the connector is configured to be removably coupled to a data input/output tool that is configured to download data to the memory of the battery management system, read information stored in the memory, or both.

14. The battery module of claim 1, wherein the connector is configured for power input, power output, data input, and data output.

15. The battery module of claim 1, wherein the connector comprises a female pin connector.

16. The battery module of claim 1, wherein the connector comprises a proprietary geometry that conforms to a connection standard that provides a high intrusion protection rating.

17. The battery module of claim 1, wherein the connector is configured to receive a charging voltage from a battery charger removably coupled to the connector, and wherein the connector is configured to provide the charging voltage through the battery management system and to the positive and negative terminals.

18. The battery module of claim 1, wherein the connector is configured to be removably coupled to a state of charge indicator and the charge indicator is configured to provide an indication of a state of charge of the battery module.

19. The battery module of claim 18, wherein the plurality of electrical contacts comprises a first electrical contact configured to transmit power to the state of charge indicator to activate an indicator light of the state of charge indicator.

20. The battery module of claim 19, wherein the plurality of electrical contacts comprises a second electrical contact configured to transmit power to the state of charge indicator, when the state of charge indicator is coupled to the connector, to activate a second indicator light of the state of charge indicator.

21. The battery module of claim 20, wherein the one or more operational parameters of the battery module comprise a state of charge of the battery module, and wherein the battery management system is configured to determine whether to send power to the state of charge indicator via the first electrical contact or the second electrical contact based on the state of charge of the battery module.

22. The battery module of claim 20, wherein the connector is configured to be removably coupled to a data input/output tool, and wherein the plurality of electrical contacts comprises a third electrical contact configured to transmit data to the data input/output tool and a fourth electrical contact configured to receive data from the data input/output tool.

23. The battery module of claim 18, wherein the plurality of electrical contacts comprises a pair of electrical contacts configured to transmit charge from a charging device coupled to the state of charge indicator to the battery management system.

24. A battery module, comprising:
a housing;
a plurality of battery cells disposed in the housing;
a battery management system disposed in the housing and electrically coupled to a positive terminal and a negative terminal of the battery module, wherein the battery management system comprises:
a thermocouple configured to generate a signal related to a temperature of the battery module;
a voltmeter configured to generate a signal related to a voltage of the battery module;
a processor configured to determine one or more operational parameters of the battery module based at least in part upon the signal from the thermocouple and the signal from the voltmeter; and
a memory configured to store operational parameter history information, usage information, or a combination thereof; and
a connector disposed in an outer surface of the housing, wherein the connector is electrically coupled to the battery management system, and wherein the connector is configured for power input, power output, data input, and data output.

25. The battery module of claim 24, wherein the connector is configured to be removably coupled to a state of charge indicator and to a data input/out tool configured to download information to the memory or read information stored in the memory.

26. The battery module of claim 24, wherein the battery module is configured to receive charge from a charging system via the connector.

27. The battery module of claim 24, wherein the connector comprises a female pin connector.

* * * * *